(12) United States Patent
Tanimoto et al.

(10) Patent No.: US 9,502,103 B1
(45) Date of Patent: Nov. 22, 2016

(54) SEMICONDUCTOR MEMORY DEVICE

(71) Applicant: KABUSHIKI KAISHA TOSHIBA, Minato-ku (JP)

(72) Inventors: Hiroyoshi Tanimoto, Yokohama (JP); Takashi Izumida, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/068,744

(22) Filed: Mar. 14, 2016

Related U.S. Application Data

(60) Provisional application No. 62/237,631, filed on Oct. 6, 2015.

(51) Int. Cl.
*G11C 13/00* (2006.01)
*H01L 27/24* (2006.01)
*H01L 23/528* (2006.01)
*H01L 45/00* (2006.01)

(52) U.S. Cl.
CPC ......... *G11C 13/0007* (2013.01); *G11C 13/004* (2013.01); *G11C 13/0026* (2013.01); *G11C 13/0069* (2013.01); *G11C 13/0097* (2013.01); *H01L 23/528* (2013.01); *H01L 27/249* (2013.01); *H01L 45/146* (2013.01); *G11C 2013/0045* (2013.01); *G11C 2013/0078* (2013.01); *G11C 2213/32* (2013.01); *G11C 2213/71* (2013.01)

(58) Field of Classification Search
CPC .......... G11C 13/0069; G11C 13/0004; G11C 13/0007
USPC .......................................... 365/148, 163, 72
See application file for complete search history.

(56) References Cited

U.S. PATENT DOCUMENTS

| 8,830,740 B2 | 9/2014 | Sasago et al. |
| 2014/0085961 A1* | 3/2014 | Kanamori ............... G11C 5/063 365/72 |
| 2014/0246646 A1 | 9/2014 | Sasago et al. |
| 2015/0146474 A1 | 5/2015 | Murooka |

FOREIGN PATENT DOCUMENTS

| JP | 5396544 | 1/2014 |
| JP | 2015-103271 | 6/2015 |
| WO | WO 2013/051066 A1 | 4/2013 |

* cited by examiner

*Primary Examiner* — Jason Lappas
(74) *Attorney, Agent, or Firm* — Oblon, McClelland, Maier & Neustadt, L.L.P.

(57) ABSTRACT

A semiconductor memory device according to an embodiment includes: a semiconductor substrate; and a memory cell array which is arranged above the semiconductor substrate in a first direction. The memory cell array includes: a semiconductor layer which extends in the first direction; a first conductive line which extends in a second direction crossing the first direction; a variable resistance film which is arranged at an intersection between the semiconductor layer and the first conductive line; a plurality of second conductive lines which are arranged in the second direction sandwiching the semiconductor layer and extend in the first direction; and a plurality of third conductive lines which are electrically connected to the second conductive lines. Two of the second conductive lines neighboring to each other in the second direction with the semiconductor layer interposed therebetween are electrically connected to different third conductive lines.

17 Claims, 7 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/237,631, filed on Oct. 6, 2015, the entire contents of which are incorporated herein by reference.

BACKGROUND

Field

An embodiment of the present invention relates to a semiconductor memory device.

Description of the Related Art

Recent years, along increase in degree of integration of semiconductor memory devices, large-scale integration (LSI) elements constituting the semiconductor memory devices have been gradually miniaturized. Not only simply narrowing a line width, but also improving dimensional accuracy and positional accuracy of a circuit pattern is also required for the miniaturization of the LSI element. A resistive RAM (ReRAM) in which a variable resistance element that variably changes a resistance value is used in a memory cell has been proposed as a technique of overcoming such a problem. Further, a ReRAM having a three-dimensional structure in which the variable resistance element is arranged at each intersection between a plurality of stacked word lines extending in parallel with a semiconductor substrate, and a bit line extending vertically to the semiconductor substrate has been proposed in order to achieve further increase in the degree of integration. Further, a technique to control leakage current during an access operation by performing on/off control of the bit line has been also proposed for the ReRAM having the three-dimensional structure.

DETAILED DESCRIPTION

A semiconductor memory device according to an embodiment includes: a semiconductor substrate; and a memory cell array which is arranged above the semiconductor substrate in a first direction, the memory cell array including: a semiconductor layer which extends in the first direction; a first conductive line which extends in a second direction crossing the first direction; a variable resistance film which is arranged at an intersection between the semiconductor layer and the first conductive line; a plurality of second conductive lines which are arranged in the second direction sandwiching the semiconductor layer and extend in the first direction; and a plurality of third conductive lines which are electrically connected to the second conductive lines, two of the second conductive lines, which neighbor to each other in the second direction with the semiconductor layer interposed therebetween, being electrically connected to different third conductive lines.

Hereinafter, a semiconductor memory device according to an embodiment will be described with reference to the drawings.

First, a description will be given regarding the entire configuration of the semiconductor memory device according to the embodiment.

Figure 1:
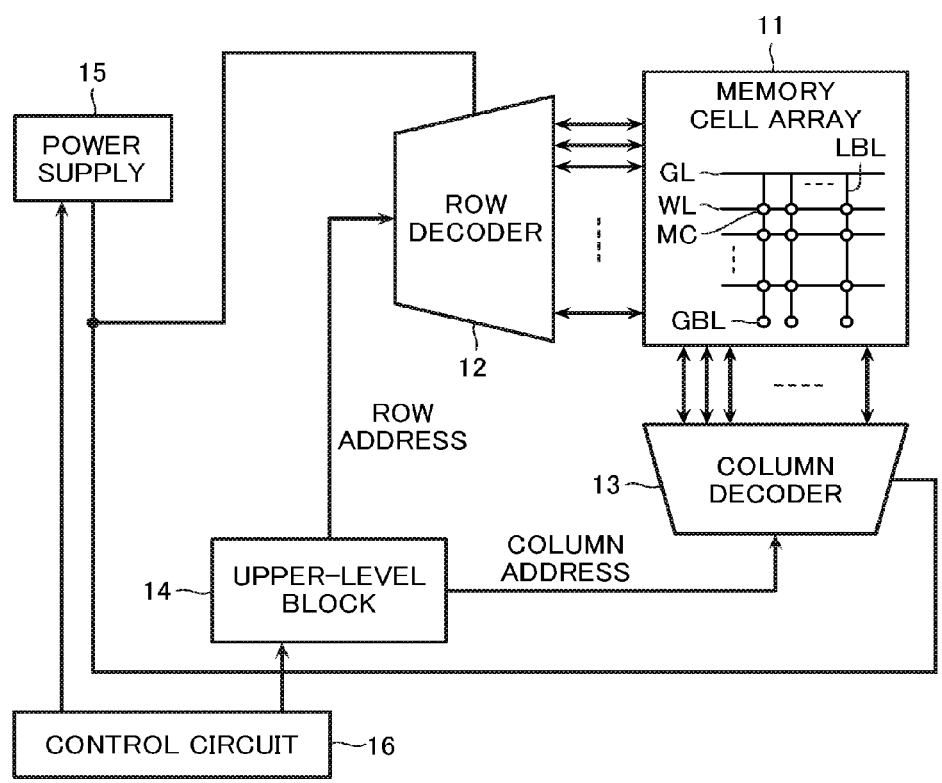
FIG. 1 is a functional block diagram of a semiconductor memory device according to an embodiment.

FIG. 1 is a functional block diagram of the semiconductor memory device according to the embodiment.

The semiconductor memory device according to the embodiment is provided with a memory cell array 11, a row decoder 12, a column decoder 13, an upper-level block 14, a power supply 15, and a control circuit 16. Incidentally, the row decoder 12, the column decoder 13, the upper-level block 14, the power supply 15, and the control circuit 16 except for the memory cell array 11 configure a control unit.

The memory cell array 11 has a plurality of word lines WL and local bit lines LBL intersecting each other, and a memory cell MC arranged at each intersection thereof.

A lower end of the local bit line LBL is electrically connected to a global bit line GBL. The row decoder 12 selects the word line WL and a gate line GL during an access (erase/write/read) operation. The column decoder 13 selects the global bit line GBL during the access operation.

The upper-level block 14 selects the memory cell MC as an object to be accessed in the memory cell array 11. The upper-level block 14 imparts a row address and a column address to each of the row decoder 12 and the column decoder 13. The power supply 15 generates a predetermined voltage combination corresponding to each erase/write/read operation, and supplies the resultant to the row decoder 12 and the column decoder 13. The control circuit 16 transmits an address to the upper-level block 14 or controls the power supply 15 according to a command from outside.

Next, a description will be given regarding a circuit configuration of the memory cell array 11.

Figure 2:
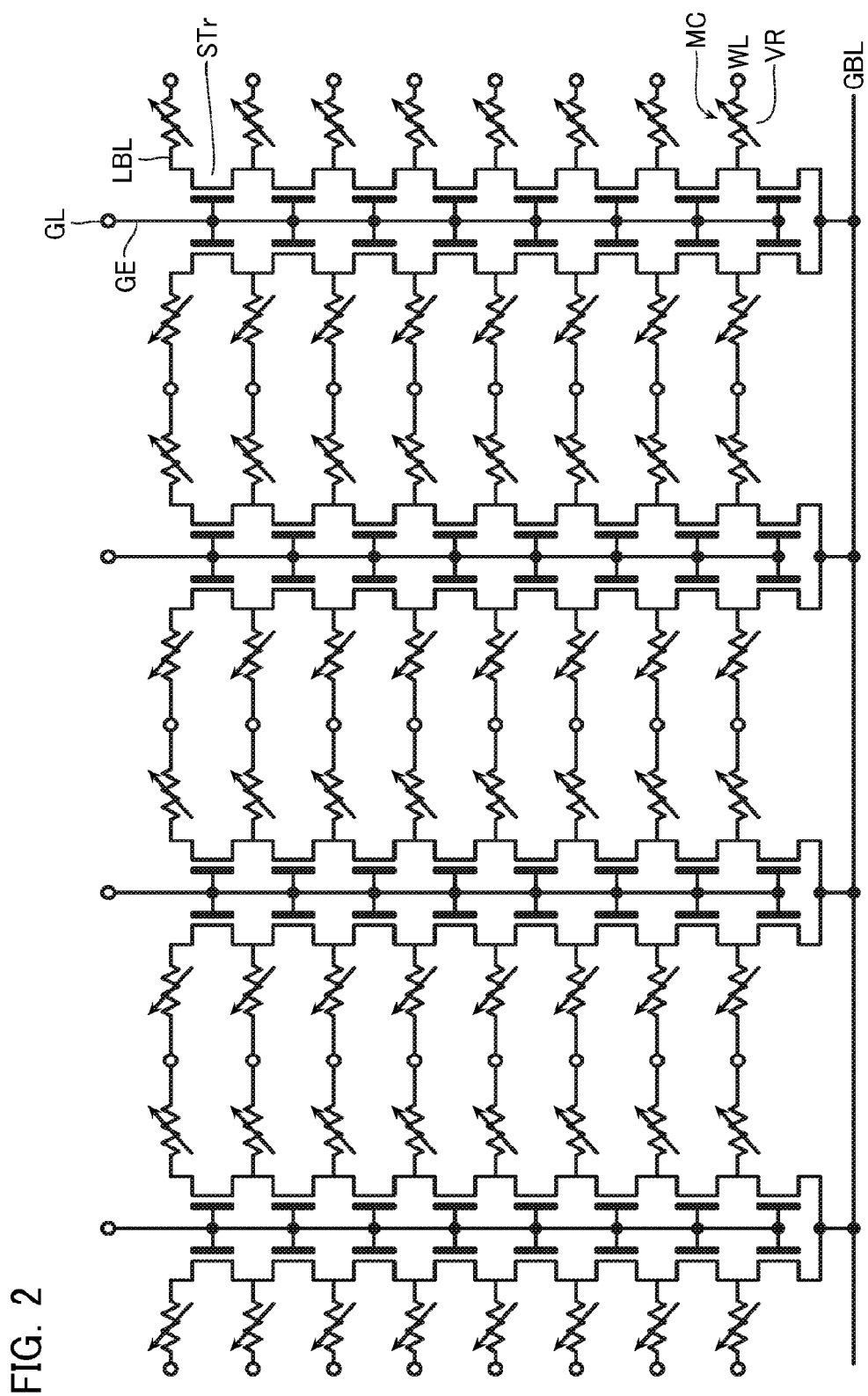
FIG. 2 is a circuit diagram of a memory cell array of the semiconductor memory device according to the embodiment.

FIG. 2 is a circuit diagram of the memory cell array of the semiconductor memory device according to the embodiment.

The memory cell array 11 has the word lines WL (first conductive lines), the local bit lines LBL intersecting the word lines WL, the memory cells MC connected to the intersections between the word lines WL and the local bit lines LBL, and the global bit line GBL connected commonly to the lower ends of the local bit lines LBL. The single local bit line LBL has a plurality of selection transistors STr connected in series. Gate electrodes GE (second conductive lines) of the selection transistors STr are collectively controlled by a single gate line GL (third conductive line).

The memory cell MC has a variable resistance element VR. The variable resistance element VR can be electrically re-written and stores data in a non-volatile manner based on a resistance value. The variable resistance element VR represents a set operation and a reset operation when a certain level or higher voltage is applied to both ends thereof. The set operation is an operation in which the variable resistance element VR in a high-resistance state (reset state) is transitioned to a low-resistance state (set state). The reset operation is an operation in which the variable resistance element VR in the low-resistance state (set state) is transitioned to the high-resistance state (reset state). Incidentally, the variable resistance element VR also represents a forming operation other than the set operation and the reset operation. The variable resistance element VR immediately after being manufactured is in the high-resistance state in which a resistance state is not easily transitioned, but the forming operation is an operation in which a region (filament path) in which current easily flows is formed inside the variable resistance element when a voltage higher than those of the set operation and the reset operation is applied to both the ends of the variable resistance element VR. The variable resistance element VR becomes the state of being operable as a memory element via the forming operation.

Next, a description will be given regarding a structure of the memory cell array 11.

Figure 3:
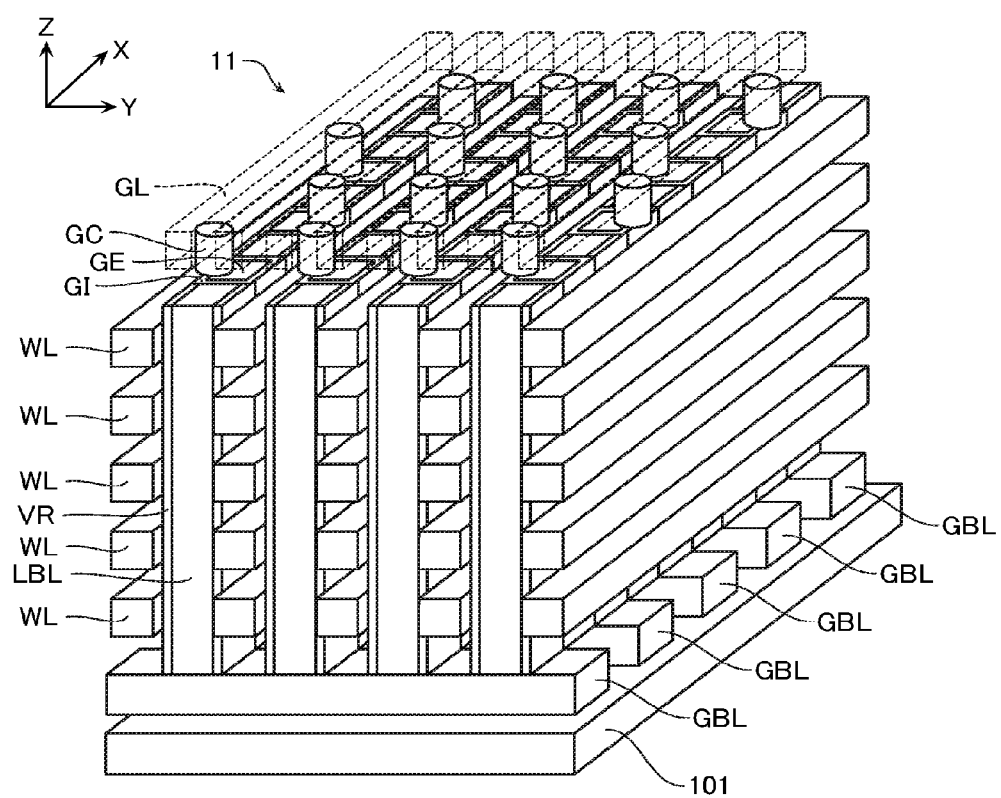
FIG. 3 is a perspective view illustrating a structure of the memory cell array of the semiconductor memory device according to the embodiment.
Figure 4:
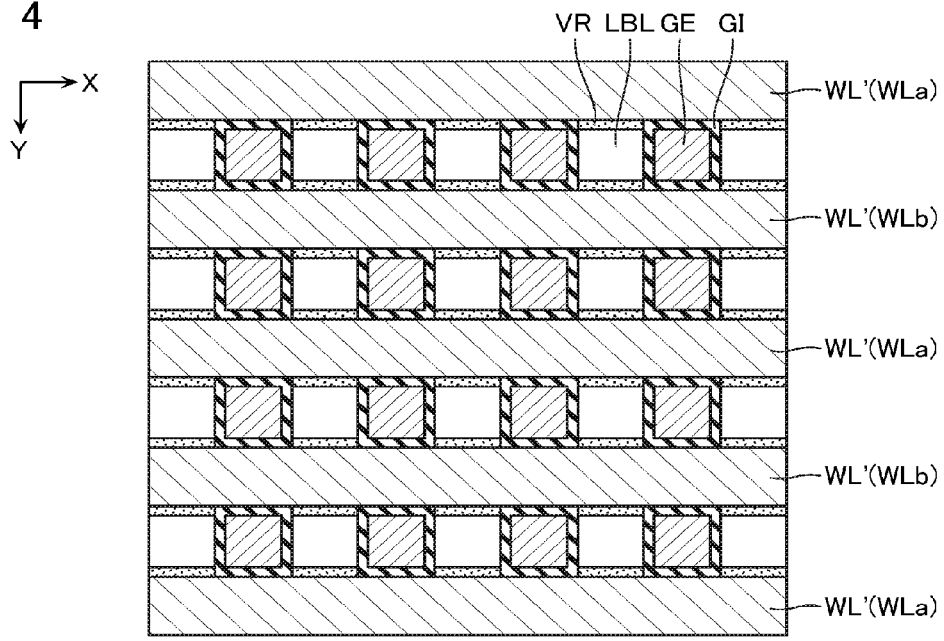
FIG. 4 is a cross-sectional view illustrating the structure of the memory cell array of the semiconductor memory device according to the embodiment.
Figure 5:
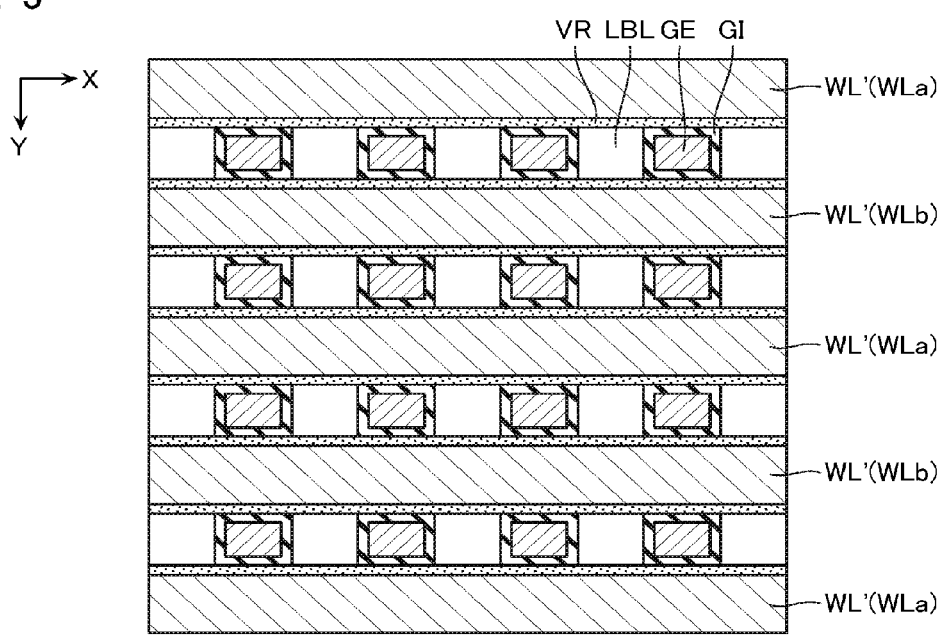
FIG. 5 is a cross-sectional view illustrating another structure of the memory cell array of the semiconductor memory device according to the embodiment.

FIG. 3 is a perspective view illustrating the structure of the memory cell array of the semiconductor memory device according to the embodiment. In addition, FIGS. 4 and 5 are cross-sectional views illustrating the structure of the same memory cell array. FIGS. 4 and 5 are the cross-sectional views taken along X-Y directions cut at a position of the word line WL in a Z direction. Hereinafter, three directions orthogonal to each other will be referred to as the "X direction", the "Y direction" and the "Z direction" in some cases.

The memory cell array 11 is arranged on a semiconductor substrate 101 which has a principal plane expanding in the X-Y direction as illustrated in FIG. 3.

The memory cell array 11 has the word lines WL which are stacked at a predetermined pitch in the Y direction and the Z direction above the semiconductor substrate 101. Each of the word lines WL has a comb shape, and a predetermined word line WLa and another word line WLb neighboring to the word line WLa in the Y direction are arranged such that respective comb tooth portions WL' thereof are alternately arranged in the Y direction. That is, the comb tooth portion WL' arranged at an odd-numbered position and the comb tooth portion WL' arranged at an even-numbered position in the Y direction are collectively driven.

The word line WL is made of for example, tungsten (W), tungsten nitride (WN), tungsten silicide ($WSi_x$), tantalum (Ta), tantalum nitride (TaN), tantalum silicide ($TaSi_x$), palladium silicide ($PdSi_x$), erbium silicide ($ErSi_x$), yttrium silicide ($YSi_x$), platinum silicide ($PtSi_x$), hafnium silicide ($HfSi_x$), nickel silicide ($NiSi_x$), cobalt silicide ($CoSi_x$), titanium silicide ($TiSi_x$), vanadium silicide ($VSi_x$), chromium silicide ($CrSi_x$), manganese silicide ($MnSi_x$), iron silicide ($FeSi_x$), ruthenium (Ru), molybdenum (Mo), titanium (Ti), vanadium (V), chromium (Cr), manganese (Mn), iron (Fe), cobalt (Co), nickel (Ni), gold (Au), silver (Ag), or copper (Cu) including polysilicon (Poly-Si) or a compound thereof.

Further, the word line WL may be made of polysilicon (Poly-Si) added with an impurity, for example.

In addition, the memory cell array 11 has the local bit lines LBL (semiconductor layers) each of which has side surfaces opposing side surfaces in the Y direction of the word line WL, extends in the Z direction and has a columnar shape. The local bit lines LBL are arranged in a matrix form in the X direction and the Y direction. Here, the local bit line LBL is formed using a semiconductor made of, for example, polysilicon (Poly-Si) or the like added with an impurity such as phosphorus (P), boron (B) or arsenic (As) including a semiconductor of polysilicon (Poly-Si) in which the impurity is not added. Incidentally, although the local bit line LBL has a cross-section in the X-Y directions in a rectangular shape in FIGS. 4 and 5, a long-and-short relationship between a length in the X direction and a length in the Y direction of the cross-section is arbitrary.

In addition, the memory cell array 11 has the variable resistance elements VR (variable resistance films) arranged at the intersections between the word line WL and the local bit line LBL. The variable resistance element VR is made of a transition metal oxide such as chromium (Cr), tungsten (W), vanadium (V), niobium (Nb), tantalum (Ta), titanium (Ti), zirconium (Zr), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), tin (Sn), lead (Pb) or bismuth (Bi) including a metal oxide film such as hafnium oxide ($HfO_x$) or oxide such as a so-called rare earth element including lantern (La) to lutetium (Lu). A thickness of the variable resistance element VR is about, for example, 5 nm, but can be changed as appropriate within a range of about 2 to 10 nm.

Here, although the variable resistance element VR arranged at an intersection between the word line WL and the local bit line LBL and the variable resistance element VR arranged at an intersection between the same the word line WL and another local bit line LBL neighboring to the local bit line LBL in the X direction are separated from each other in the X direction in FIGS. 3 and 4, the variable resistance elements VR may be formed in an integrated manner in the X direction on consideration of convenience in a manufacturing process as illustrated in FIG. 5.

In addition, the memory cell array 11 has the global bit lines GBL which extend in the Y direction and are electrically connected to the lower ends of the local bit lines LBL. The single global bit line GBL is commonly connected to the local bit lines LBL arranged side by side in the Y direction. Here, the global bit line GBL is made of the same material as that of the word line WL, for example, metal such as tungsten (W), a compound of metal and a semiconductor such as tungsten silicide (WSi), a semiconductor such as polysilicon (Poly-Si) added with an impurity, or the like.

In addition, the memory cell array 11 has the gate lines GL which extend in the X direction and are arranged above the word line WL as the uppermost layer. Here, the gate line GL is made of the same material as that of the word line WL.

In addition, the memory cell array 11 has the gate electrodes GE which extend in the Z direction and are arranged in the X direction alternately with the local bit line LBL so as to sandwich the local bit line LBL. The gate electrodes GE are electrically connected to the gate lines GL, but a connection relationship thereof will be described in detail later. Each side surface of the gate electrodes GE is covered by an insulating layer GI. In other words, the insulating layer GI is arranged between the word line WL and the gate electrode GE and between the local bit line LBL and the gate electrode GE, and electrically separates the members from each other. Here, the gate electrode GE is made of, for example, n+ polysilicon (n+ Si) or titanium nitride (TiN) having a high impurity concentration.

In the case of the above-described structure, the memory cell MC including the variable resistance element VR is formed at each intersection between the word lines WL and the local bit lines LBL. That is, the memory cells MC are arranged in a three-dimensional matrix form of being arranged respectively along the X direction, the Y direction and the Z direction.

In addition, in the case of the above-described structure, the selection transistor STr having the gate electrode GE as a gate and the local bit line LBL as a channel body is formed. In a case in which the selection transistor STr has such a structure, the structure is simple as compared to a selection transistor having a structure in which the gate electrode GE is embedded in the local bit line LBL, and the controllability of the gate is also excellent.

Next, a description will be given in detail regarding the connection relationship between the gate electrode GE and the gate line GL of the embodiment upon illustrating a comparative example as a premise.

Figure 6:
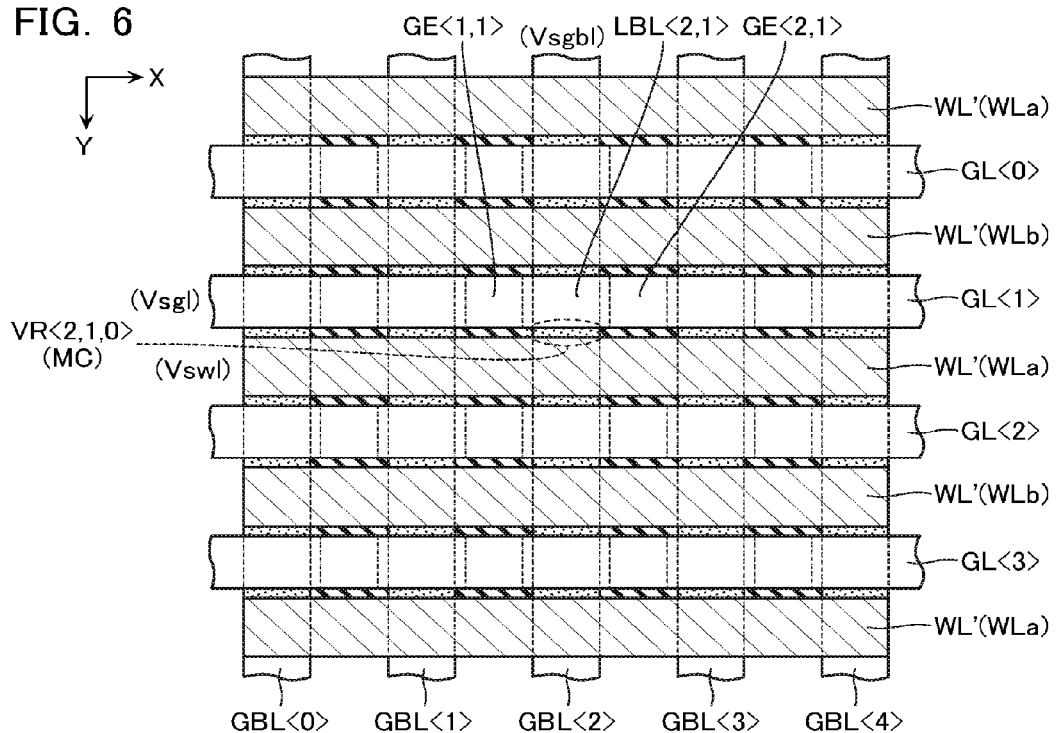
FIG. 6 is a plan view illustrating a structure of a memory cell array of a semiconductor memory device according to a comparative example with respect to the embodiment.
Figure 7:
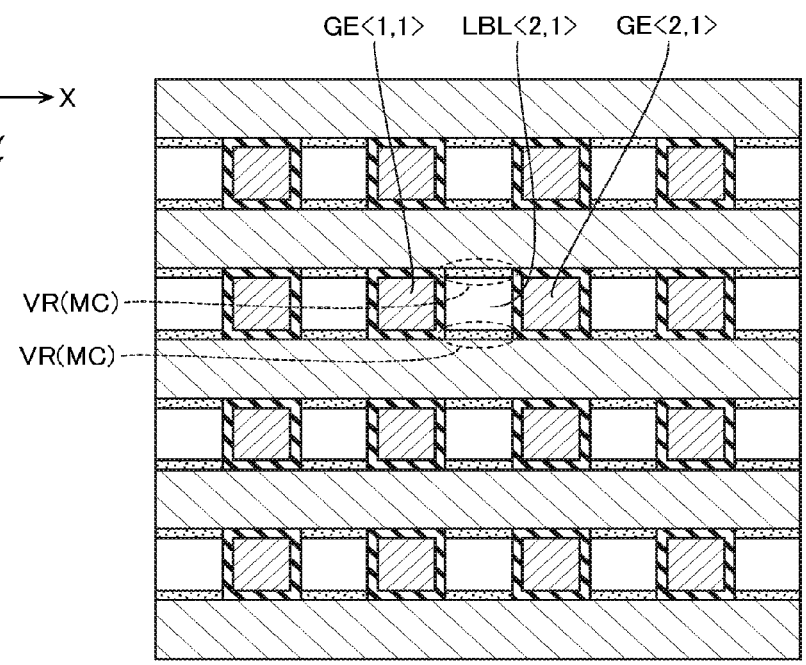
FIG. 7 is a diagram that describes arrangement of a memory cell of the semiconductor memory device according to the comparative example.

FIG. 6 is a plan view illustrating a structure of a memory cell array of a semiconductor memory device according to a comparative example with respect to the embodiment. In addition, FIG. 7 is a diagram that describes arrangement of a memory cell of the same semiconductor memory device. The same reference numeral is given to a configuration among configurations illustrated in FIGS. 6 and 7 which corresponds to the configuration illustrated in FIGS. 3 to 5.

In the case of the memory cell array of the comparative example, all the gate electrodes GE arranged side by side in the X direction are electrically connected to the single gate line GL. That is, all the gate electrodes GE arranged side by side in the X direction are collectively controlled.

Here, an access operation is considered in which WLa is a selected word line, GL<1> is a selected gate line, and GBL<2> is a selected global bit line.

In this case, first, a predetermined selection voltage Vsgl is applied from the selected gate line GL<1> to gate electrodes GE<1,1> and <2,1>. Then, a channel (current path) is formed in a local bit line LBL<2,1> due to a potential difference Vsgl-Vsgbl between the selection voltage Vsgl and a predetermined selection voltage Vsgbl of the selected global bit line GBL<2>. When a predetermined selection voltage Vswl is applied to the selected word line WLa in such a state, a cell current flows in a variable resistance element VR<2,1,0> at an intersection between the selected word line WLa and the local bit line LBL<2,1>. In this manner, the memory cell MC including the variable resistance element VR<2,1,0> is accessed.

The local bit line LBL (LBL<2,1> in the case of FIG. 7) receives the same control at the same time from the two gate electrodes GE (GE<1,1> and <2,1> in the case of FIG. 7), which sandwich the local bit line LBL, in the case of the comparative example, and thus, the entire single local bit line LBL is becomes a unit of control. Thus, the entire variable resistance element VR at an intersection between the single word line WL and the single local bit line LBL corresponds to the single memory cell MC as a unit of access. That is, the number of the memory cells MC per single layer is two as illustrated by the broken-line ellipse of FIG. 7 in the case of focusing on the single local bit line LBL (LBL<2,1> in the case of FIG. 7).

On the contrary, the gate electrode GE and the gate line GL are connected as follows in the embodiment.

Figure 8:
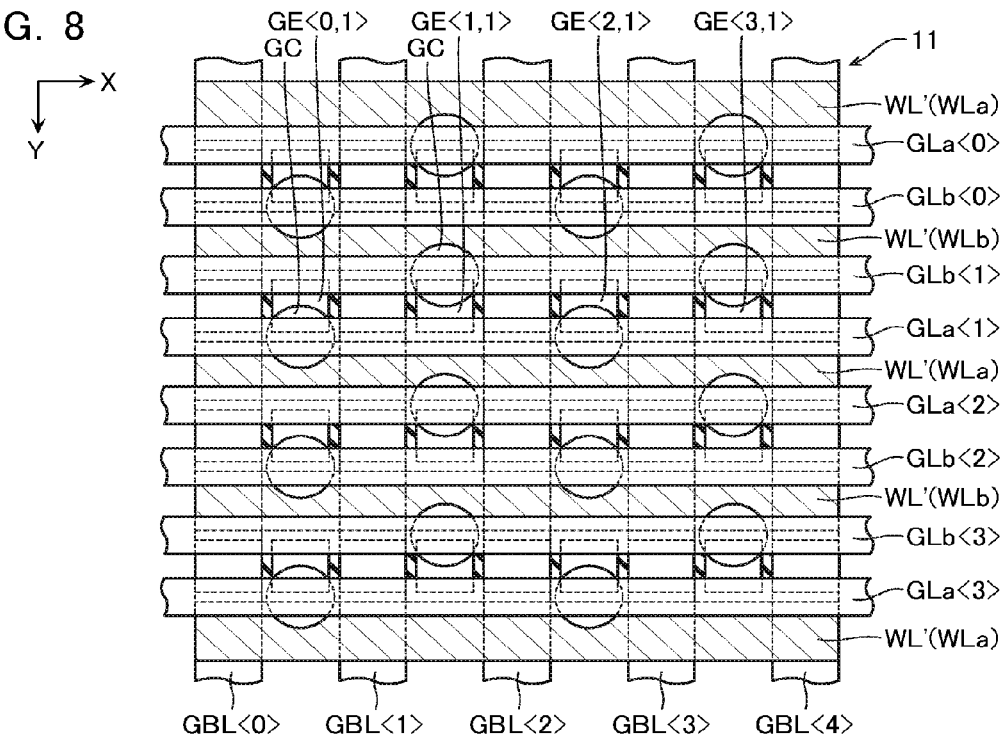
FIG. 8 is a plan view illustrating a structure of the memory cell array of the semiconductor memory device according to the embodiment.

FIG. 8 is a plan view illustrating the structure of the memory cell array of the semiconductor memory device according to the embodiment.

In the case of the memory cell array 11 of the embodiment, two gate lines GLa and GLb extending in parallel with the X direction are provided for each row of the gate electrodes GE arranged side by side in the X direction. Thus, the gate lines GL are arranged at an approximately half pitch in the Y direction as compared to the comparative example. Further, every other electrode of the gate electrodes GE arranged side by side in the X direction is electrically connected commonly to the same gate line GL. That is, the two gate electrodes GE, which sandwich the single local bit line LBL in the X direction, are electrically connected to the different gate lines GL. To be specific, gate electrodes GE<0, 1> and <2,1> among the gate electrodes GE<0,1> to <3,1> arranged side by side in the X direction are electrically connected to a gate line GLa<1>, for example, and the gate electrodes GE<1,1> and <3,1> are connected to a gate line GLb<1> neighboring to the gate line GLa<1> in the Y direction. Each of the gate electrodes GE and each of the gate lines GL are electrically connected to each other via a gate connection line GC which has a columnar shape and extends in the Z direction. The gate connection lines GC in contact with the gate electrodes GE arranged side by side in the X direction are in contact with the gate lines GLa and GLb arranged at different positions in the Y direction, and thus, are arranged in a zigzag form along the X direction when viewed from the Z direction. In other words, every other line of the gate connection lines GC is arranged at the same position in the Y direction. Further, the two gate connection lines GC, which are in contact with the two gate electrodes GE that sandwich a predetermined one of the local bit lines LBL in the X direction, are arranged at different positions in the Y direction.

Next, a description will be given regarding the access operation with respect to the memory cell MC of the embodiment and arrangement of the memory cell MC.

Figure 9:
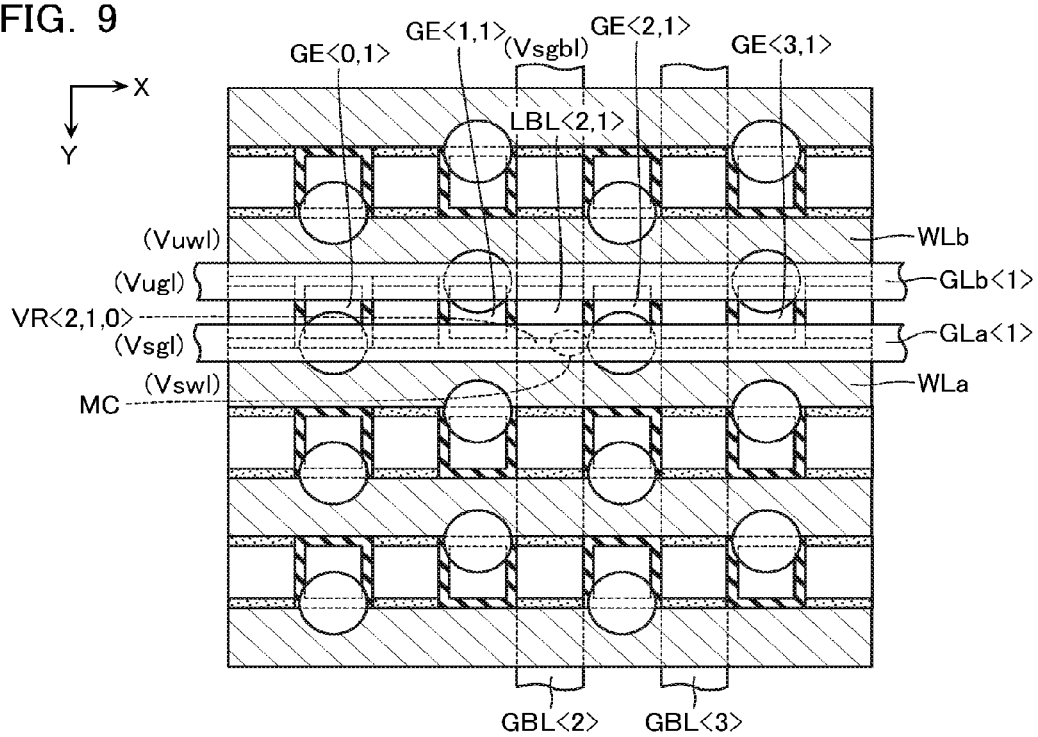
FIG. 9 is a diagram that describes an access operation of the memory cell array of the semiconductor memory device according to the embodiment.
Figure 10:
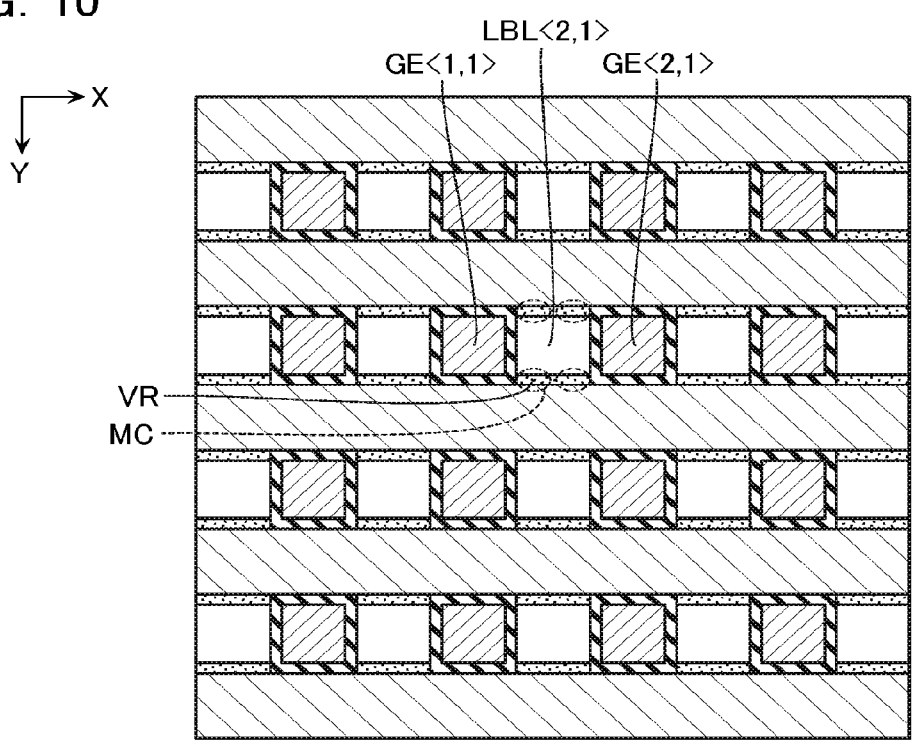
FIG. 10 is a diagram that describes arrangement of a memory cell of the semiconductor memory device according to the embodiment.

FIG. 9 is a diagram that describes the access operation of the memory cell array of the semiconductor memory device according to the embodiment, and FIG. 10 is a diagram that describes the arrangement of the memory cell of the same semiconductor memory device. FIG. 9 illustrates a case in which WLa is the selected word line, WLb is an unselected word line, GBL<2> is the selected global bit line, GLa<1> is the selected gate line, and GLb<1> is an unselected gate line. Incidentally, the global bit line GBL and the gate line GL, which are irrelevant to the description, are not illustrated in FIG. 9.

First, the predetermined selection voltage Vsgl (for example, 3.0 V) is applied from the selected gate line GLa<1> to the gate electrodes GE<0, 1> and <2,1>, and a predetermined non-selection voltage Vugl (for example, 0 V) is applied from the unselected gate line GLb<1> to the gate electrodes GE<1, 1> and <3,1>. In addition, the predetermined selection voltage Vsgbl (for example, 0 V) is applied to the selected global bit line GBL<2>. In this case, the potential difference Vsgl-Vsgbl (for example, 3.0 V) is generated between the selected gate line GLa<1> and the selected global bit line GBL<2> while only a potential difference Vugl-Vsgbl (for example, 0 V) is generated between the unselected gate line GLb<1> and the selected global bit line GBL<2>. As a result, a channel is formed only in the vicinity of the side surface at the gate electrode GE<2,1> side in the local bit line LBL<2,1>, and a channel is not formed in the vicinity of the side surface at the gate electrode GE<1,1> side. In such a state, a predetermined selection voltage Vswl (for example, 2.0 V) is applied to the selected word line WLa, and a non-selection voltage Vuwl (for example, 0 V) is applied to the unselected word line WLb. In this case, a cell current flows only in a part at the gate electrode GE<2,1> side in a variable resistance element VR<2,1,0> at an intersection between the selected word line WLa and the local bit line LBL<2,1>, and a cell current does not flow in a part at the gate electrode GE<1,1> side. That is, only the part at the gate electrode GE<2,1> side, illustrated by the broken-line ellipse of FIG. 9, of the variable resistance element VR<2,1,0> is accessed. This means that it is possible to independently access the part at the gate electrode GE<1,1> side of the variable resistance element VR<2, 1,0> and the part at the gate electrode GE<2,1> side. Further, it is possible to consider that the two memory cells MC are arranged in the variable resistance element VR at the intersection between the word line WLa and the local bit line LBL<2,1>.

Incidentally, although 0 V is applied, as the non-selection voltage Vugl, to the unselected gate line GLb<1> in the example described above, a negative voltage (for example, −1.0 V) may be applied instead. In this case, the power supply 15 needs to be capable of supplying the negative voltage, but it is possible to more reliably suppress the formation of the channel in the part at the gate electrode GE<1,1> side in the local bit line LBL<2,1>.

The local bit line LBL (LBL<2,1> in the case of FIG. 10) is controlled independently by the two gate electrodes GE (GE<1,1> and <2,1> in the case of FIG. 10), which sandwich this local bit line LBL in the embodiment, and thus, each part at the gate electrode GE<1,1> side and at the gate electrode GE<2,1> side of the single local bit line LBL is the unit of control. Thus, it is possible to use the variable resistance element VR at the intersection between the single word line WL and the single local bit line LBL for the two memory cells MC. That is, the number of the memory cells MC per single layer is four, twice the number of the comparative example, as illustrated by the broken-line ellipse of FIG. 10 in the case of focusing on the single local bit line LBL (LBL<2,1> in the case of FIG. 10). This means that the memory capacity per the same size is twice of that of the comparative example.

As above, according to the embodiment, it is possible to arrange the two memory cells MC for each intersection between the word lines WL and the local bit lines LBL. That is, it is possible to provide the semiconductor memory device which has a chip size at the same level as that of the comparative example, and has twice the memory capacity of the comparative example.

[Others]

As above, certain embodiments of the present invention have been described, but these embodiments have been presented by way of example, and are not intended to limit the scope of the invention. The novel embodiments can be implemented in various other forms, and various omissions, substitutions and changes can be made in the scope not departing from a gist of the invention. The accompanying claims and their equivalents are intended to cover these embodiment and such modifications as would fall within the scope and gist of the inventions.

What is claimed is:
1. A semiconductor memory device comprising:
a semiconductor substrate; and
a memory cell array which is arranged above the semiconductor substrate in a first direction,
the memory cell array including:
a semiconductor layer which extends in the first direction;
a first conductive line which extends in a second direction crossing the first direction;
a variable resistance film which is arranged at an intersection between the semiconductor layer and the first conductive line;
a plurality of second conductive lines which are arranged in the second direction sandwiching the semiconductor layer and extend in the first direction; and
a plurality of third conductive lines which are electrically connected to the second conductive lines,
two of the second conductive lines, which neighbor to each other in the second direction with the semiconductor layer interposed therebetween, being electrically connected to different third conductive lines.

2. The semiconductor memory device according to claim 1, wherein
every other line of the second conductive lines is electrically connected commonly to one of the third conductive lines in the second direction.

3. The semiconductor memory device according to claim 1, wherein
the memory cell array has a plurality of connection lines which are in contact with the second conductive lines and electrically connect the second conductive lines with the third conductive lines.

4. The semiconductor memory device according to claim 3, wherein
one of the connection lines to be in contact with a predetermined one of the second conductive lines and another one of the connection lines to be in contact with another one of the second conductive lines, which neighbors to the predetermined second conductive line with the semiconductor layer interposed therebetween, are arranged at different positions in a third direction crossing the first and second directions.

5. The semiconductor memory device according to claim 4, wherein
every other line in the second direction of the connection lines to be in contact with the second conductive lines is arranged at the same position in the third direction crossing the first direction and the second direction.

6. The semiconductor memory device according to claim 1, wherein
the memory cell array has a plurality of the semiconductor layers arranged side by side in the second direction, and
the variable resistance film, arranged at an intersection between the first conductive line and a predetermined one of the semiconductor layers, and the variable resistance film, arranged at an intersection between the first conductive line and another one of the semiconductor layers neighboring to the predetermined semiconductor layer in the second direction, are separated from each other.

7. The semiconductor memory device according to claim 1, wherein
the memory cell array has a plurality of the semiconductor layers arranged side by side in the second direction, and
the variable resistance film, arranged at an intersection between the first conductive line and a predetermined one of the semiconductor layers, and the variable resistance film, arranged at an intersection between the first conductive line and another one of the semiconductor layers neighboring to the predetermined semiconductor layer in the second direction, are formed in an integrated manner.

8. The semiconductor memory device according to claim 1, wherein
the memory cell array has an insulating layer arranged between the first conductive line and one of the second conductive lines.

9. The semiconductor memory device according to claim 1, wherein
the memory cell array has an insulating layer arranged between the semiconductor layer and one of the second conductive lines.

10. A semiconductor memory device comprising:
a semiconductor substrate;
a memory cell array which is arranged above the semiconductor substrate and has a plurality of memory cells; and
a control unit that applies a voltage to the memory cell array and executes an access operation with respect to one of the memory cells,
the memory cell array including:
a semiconductor layer which extends in a first direction;
a first conductive line which extends in a second direction crossing the first direction;
a variable resistance film which is arranged at an intersection between the semiconductor layer and the first conductive line;
a plurality of second conductive lines which are arranged in the second direction sandwiching the semiconductor layer and extend in the first direction; and
a plurality of third conductive lines which are electrically connected to the second conductive lines,
the control unit applying a first voltage to any one between two of the second conductive lines, which neighbor to each other in the second direction with the semiconductor layer interposed therebetween, during the access operation and applying a second voltage, different from the first voltage, to the other second conductive line.

11. The semiconductor memory device according to claim 10, wherein
the second voltage is a ground voltage.

12. The semiconductor memory device according to claim 10, wherein
the second voltage has a different polarity from the first voltage.

13. The semiconductor memory device according to claim 10, wherein
the control unit applies the same voltage to every other line of the second conductive lines arranged in the second direction during the access operation.

14. The semiconductor memory device according to claim 10, wherein
the memory cell array has a plurality of the first conductive lines which are arranged sandwiching the semiconductor layer in a third direction crossing the first and second directions, and
the control unit applies a third voltage to any one of two of the first conductive lines, which neighbor to each other in the third direction with the semiconductor layer interposed therebetween, during the access operation, and applies a fourth voltage, different from the third voltage, to the other first conductive line.

15. The semiconductor memory device according to claim 14, wherein
the control unit executes a write operation to write data to the memory cell and a read operation to read data from the memory cell as the access operation, and
the third voltage to be applied in the write operation is higher than the third voltage to be applied in the read operation.

16. The semiconductor memory device according to claim 14, wherein
the memory cell stores data using a resistance state of the variable resistance film,
the control unit executes a set operation in which the variable resistance film is set to a low-resistance state, and a reset operation in which the variable resistance film is set to a high-resistance state as the access operation, and
the third voltage to be applied in the reset operation is higher than the third voltage to be applied in the read operation.

17. The semiconductor memory device according to claim 10, wherein
the variable resistance film has a first part and a second part arranged side by side in the second direction, and
resistance states of the first part and the second part are transitioned in a mutually independent manner.

* * * * *